(12) United States Patent
Lee et al.

(10) Patent No.: US 9,484,087 B2
(45) Date of Patent: Nov. 1, 2016

(54) MULTI-BIT MEMORY ELEMENTS, MEMORY DEVICES INCLUDING THE SAME, AND METHODS OF MANUFACTURING THE SAME

(75) Inventors: Chang-bum Lee, Seoul (KR); Chang-jung Kim, Yongin-si (KR); Young-bae Kim, Seoul (KR); Myoung-jae Lee, Hwaseong-si (KR); Dong-soo Lee, Gunpo-si (KR); Man Chang, Seongnam-si (KR); Seung-ryul Lee, Seoul (KR); Kyung-min Kim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 705 days.

(21) Appl. No.: 13/483,578

(22) Filed: May 30, 2012

(65) Prior Publication Data

US 2012/0319076 A1 Dec. 20, 2012

(30) Foreign Application Priority Data

Jun. 16, 2011 (KR) ........................ 10-2011-0058644

(51) Int. Cl.
  *H01L 47/00* (2006.01)
  *G11C 11/56* (2006.01)
  *H01L 45/00* (2006.01)
  *H01L 27/24* (2006.01)

(52) U.S. Cl.
  CPC ....... *G11C 11/5685* (2013.01); *H01L 27/2409* (2013.01); *H01L 27/2481* (2013.01); *H01L 45/08* (2013.01); *H01L 45/1233* (2013.01); *H01L 45/146* (2013.01); *H01L 45/1658* (2013.01); *H01L 45/1675* (2013.01)

(58) Field of Classification Search
  CPC ........................... H01L 45/08; H01L 45/1658
  USPC .................................. 257/2, 5, 209
  See application file for complete search history.

(56) References Cited

U.S. PATENT DOCUMENTS

| 8,569,734 B2* | 10/2013 | Redaelli et al. ................... 257/5 |
| 2004/0159867 A1 | 8/2004 | Kinney et al. |
| 2009/0272961 A1 | 11/2009 | Miller et al. |
| 2010/0176367 A1* | 7/2010 | Liu ..................... G11C 11/5614 257/4 |
| 2011/0038196 A1 | 2/2011 | Tour et al. |
| 2011/0149634 A1* | 6/2011 | Schloss et al. ............... 365/148 |

FOREIGN PATENT DOCUMENTS

| JP | 2009124167 A | 6/2009 |
| KR | 10-2006-0083368 A | 7/2006 |
| KR | 10-2011-0005157 A | 1/2011 |
| WO | WO 2009/015297 A1 | 1/2009 |

OTHER PUBLICATIONS

European Search Report dated Oct. 23, 2012 issued in European Application No. 12169843.5.
Kim, et al., "Bi-layered RRAM with Unlimited Endurance and Extremely Uniform Switching," *2001 Symposium on VLSI Technology Digest of Technical Papers*, pp. 52-53 (Jun. 14, 2011).

* cited by examiner

*Primary Examiner* — Samuel Gebremariam
(74) *Attorney, Agent, or Firm* — Harness, Dickey & Pierce, P.L.C.

(57) ABSTRACT

In one embodiment, the memory element may include a first electrode, a second electrode spaced apart from the first electrode, a memory layer between the first electrode and the second electrode, and an auxiliary layer between the memory layer and the second electrode. The auxiliary layer provides a multi-bit memory characteristic to the memory layer.

35 Claims, 12 Drawing Sheets

< SET OPERATION >

< RESET OPERATION >

< ANNEALING >

< ANNEALING >

MULTI-BIT MEMORY ELEMENTS, MEMORY DEVICES INCLUDING THE SAME, AND METHODS OF MANUFACTURING THE SAME

CROSS-REFERENCE TO RELATED APPLICATIONS

This application claims the benefit of priority under 35 U.S.C. §119(e) from Korean Patent Application No. 10-2011-0058644, filed on Jun. 16, 2011, in the Korean Intellectual Property Office, the disclosure of which is incorporated herein in its entirety by reference.

BACKGROUND

1. Field

Example embodiments relate to multi-bit memory elements, memory devices including the same, and/or methods of manufacturing the same.

2. Description of the Related Art

Examples of non-volatile memory devices include a resistive random-access memory (RRAM), magnetic random access memory (MRAM), ferroelectric random access memory (FRAM), phase-change random access memory (PRAM), or the like. Among them, the RRAM is a resistive memory device which stores data based on a resistance change of a material. In the RRAM, the resistance of a resistance-change material is changed from a high-resistance state to a low-resistance state (also referred to as "ON state") when a voltage applied to the resistance-change material is greater than, or equal to, a set voltage. The resistance of the resistance-change material is switched back to the high-resistance state (also referred to as "OFF state") when a voltage applied to the resistance-change material is greater than, or equal to, a reset voltage.

Generally, a resistive memory device includes a storage node and a switching device. The storage node has a resistance-change material layer. The switching device is electrically connected to the storage node, and controls access of a signal to the storage node.

The need for high density and high performance of various nonvolatile memory devices, such as the resistive memory devices described above, are continuously increasing.

SUMMARY

Example embodiments relate to multi-bit memory elements, memory devices including the same, and/or methods of manufacturing the same.

Some example embodiments provide memory elements having a multi-bit memory characteristic.

Some example embodiments provide memory elements which may be operated with low voltages.

Some example embodiments provide memory devices including the memory elements.

Some example embodiments provide methods for manufacturing the memory elements and the memory devices.

Additional aspects will be set forth in part in the description which follows and, in part, will be apparent from the description, or may be learned by practice of the presented embodiments.

According to an example embodiment, a memory element includes a first electrode, a second electrode spaced apart from the first electrode, a memory layer between the first electrode and the second electrode, and an auxiliary layer between the memory layer and one of the first electrode and the second electrode and which provides a multi-bit memory characteristic to the memory layer.

The memory layer may include a first material layer and a second material layer, and the memory layer may have a resistance change characteristic due to movement of ion species between the first material layer and the second material layer. The first material layer may be an oxygen supplying layer, and the second material layer may be an oxygen exchange layer.

The first material layer may include a first metal oxide. The first metal oxide may include at least one of tantalum (Ta) oxide, zirconium (Zr) oxide, yttria-stabilized zirconia (YSZ), titanium (Ti) oxide, hafnium (Hf) oxide, manganese (Mn) oxide, magnesium (Mg) oxide, and a mixture thereof. For example, the first metal oxide may include $TaO_x$ (where $0<x<2.5$).

The second material layer may include a second metal oxide, which is either the same group as, or a different group from, the first metal oxide. The second metal oxide may include at least one of Ta oxide, Zr oxide, yttria-stabilized zirconia (YSZ), Ti oxide, Hf oxide, Mn oxide, Mg oxide, and a mixture thereof.

The oxygen concentration of the second material layer may be higher than that of the first material layer.

The first material layer may be disposed between the first electrode and the second electrode. The second material layer may be disposed between the first material layer and the second electrode. The auxiliary layer may be between the second material layer and the second electrode.

The auxiliary layer may include an oxide. The auxiliary layer may be a silicon oxide layer. The auxiliary layer may have a thickness less than, or equal to, about 10 nm. The auxiliary layer may be doped with a metal (e.g., tungsten (W)).

At least a portion of the memory layer may be doped with a metal (e.g., tungsten (W)).

The memory element may further include a buffer layer disposed between the first electrode and the memory layer. The buffer layer may contain a material that raises a potential barrier between the first electrode and the memory layer.

According to another example embodiment, a memory device includes the memory element described above. The memory device may further include a switching element connected to the memory element.

According to yet another example embodiment, a memory device includes a plurality of first wires parallel to each other, a plurality of second wires parallel to each other and crossing the first wires to form a plurality of first cross-points, and a plurality of memory cells. Each of the memory cells are at one of the first cross-points. Each of the memory cells includes a memory layer disposed between the first wires and the second wires, and an auxiliary resistive layer interposed between the memory layer and one of the first and second wires. The memory layer has a multi-bit memory characteristic.

Each of the memory cells may further include a switching element disposed between the memory layer and the second wires, and an intermediate electrode between the memory layer and the switching element.

The auxiliary resistive layer may be disposed between the memory layer and the intermediate electrode.

The memory layer may include a first material layer and a second material layer. The memory layer may have a resistance change characteristic due to movement of ion species between the first material layer and the second material layer.

The first material layer may be an oxygen supplying layer, and the second material layer may be an oxygen exchange layer. The first material layer may include a first metal oxide. The second material layer may include a second metal oxide, which is either the same group as, or a different group from, the first metal oxide. The first metal oxide may include at least one of Ta oxide, Zr oxide, yttria-stabilized zirconia (YSZ), Ti oxide, Hf oxide, Mn oxide, Mg oxide, and a mixture thereof. For example, the first metal oxide may include $TaO_x$ (where $0<x<2.5$).

The second metal oxide may include at least one of Ta oxide, Zr oxide, yttria-stabilized zirconia (YSZ), Ti oxide, Hf oxide, Mn oxide, Mg oxide, and a mixture thereof.

The auxiliary resistive layer may include an oxide. The auxiliary resistive layer may be a silicon oxide layer. The auxiliary resistive layer may have a thickness less than, or equal to, about 10 nm. The auxiliary resistive layer may be doped with a metal (e.g., tungsten (W)).

At least a portion of the memory layer may be doped with a metal (e.g., tungsten (W)). Each of the memory cells may further include a buffer layer disposed between the first wires and the memory layer. The buffer layer may include at least one of $AlO_x$, $SiO_x$, $SiN_x$, $ZrO_x$, $HfO_x$, and a mixture thereof.

Each of the memory cells may be a first memory cell. The memory device may further include a plurality of third wires parallel to each other and crossing the second wires to form a plurality of second cross-points, and a plurality of second memory cells. Each of the second memory cells may be at one of the second cross-points.

The second memory cells may have a reverse structure of the first memory cells, or the same structure as the first memory cells.

According to still another example embodiment, a method of manufacturing a memory device includes forming a first electrode, forming a memory layer on the first electrode, forming an auxiliary layer providing a multi-bit memory characteristic to the memory layer, and forming a second electrode on the memory layer.

The forming of the memory layer may include forming a first material layer on the first electrode, and forming a second material layer on the first material layer. The memory layer may have a resistance change characteristic due to movement of ion species between the first material layer and the second material layer. The first material layer may be an oxygen supplying layer, and the second material layer may be an oxygen exchange layer.

The auxiliary layer may include an oxide. The auxiliary layer may include silicon oxide.

The method may further include doping at least a portion of the auxiliary layer with a metal (e.g., tungsten (W)). The method may further include doping at least a portion of the memory layer with a metal (e.g., tungsten (W)).

The method may further include forming a buffer layer between the first electrode and the memory layer.

The method may further include forming a switching element that may be electrically connected to the memory layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
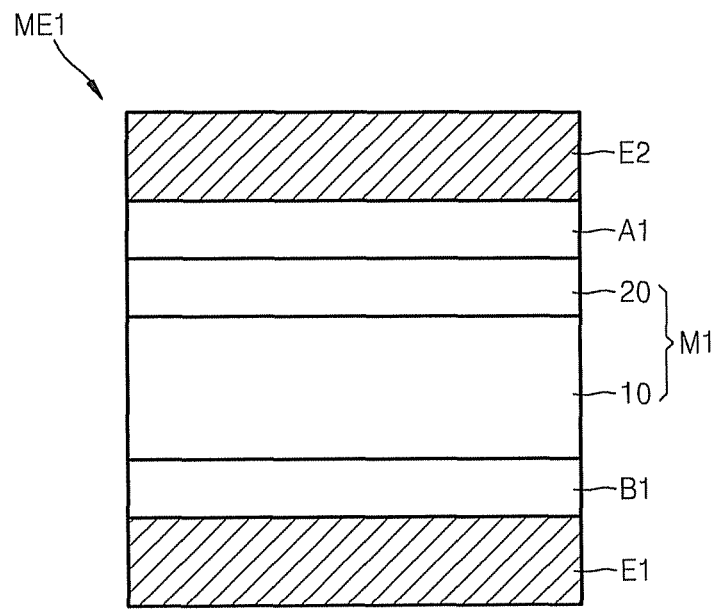
FIG. 1 is a sectional view of a memory element according to an example embodiment.

Various example embodiments will now be described more fully with reference to the accompanying drawings in which example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example embodiments relate to multi-bit memory elements, memory devices including the same, and/or methods of manufacturing the same.

FIG. 1 is a sectional view of a memory element according to an example embodiment.

Referring to FIG. 1, the memory element ME1 according to the present embodiment may include a memory layer M1 interposed between first and second electrodes E1 and E2. The memory layer M1 may have a multi-layer structure. For example, the memory layer M1 may have a double-layer structure consisting of a first material layer 10 and a second material layer 20. The memory layer M1 may have a resistance change characteristic due to movement of ion species between the first material layer 10 and the second material layer 20. A detailed description thereof will be provided later.

An auxiliary layer A1 may be arranged between the memory layer M1 and the second electrode E2, or more particularly, between the second material layer 20 and the second electrode E2. The auxiliary layer A1 may affect memory properties of the memory layer M1. In detail, the auxiliary layer A1 may be a layer that provides a multi-bit memory characteristic to the memory layer M1. In other words, the memory layer M1 may have a multi-bit memory characteristic due to the auxiliary layer A1. The multi-bit memory characteristic induced by the auxiliary layer A1 will be described later in detail. A buffer layer B1 may be arranged between the memory layer M1 and the first electrode E1, or more particularly, between the first material layer 10 and the first electrode E1. The buffer layer B1 may improve reliability, reproducibility, and stability of the memory element ME1. Detailed descriptions thereof will also be provided later.

Hereinafter, the memory element ME1 according to the present embodiment is described in closer detail.

The first material layer 10 of the memory layer M1 may be formed of a first metal oxide. For example, the first material layer 10 may contain at least one from among Ta oxide, Zr oxide, yttria-stabilized zirconia (YSZ), Ti oxide, Hf oxide, Mn oxide, Mg oxide, and a mixture thereof. In a case where the first metal oxide contains Ta oxide, the first metal oxide may be $TaO_x$ (wherein $0<x<2.5$ or $0.5 \leq x \leq 2.0$). Oxygen ions and/or oxygen vacancies may exist in the first material layer 10. The first material layer 10 may function as an oxygen supplying layer (or oxygen reservoir layer) with respect to the second material layer 20. The thickness of the first material layer 10 may be from about 1 nm to about 100 nm, for example, from about 5 nm to about 50 nm.

The second material layer 20 may exchange oxygen ions and/or oxygen vacancies with the first material layer 10, and may induce resistance change of the memory layer M1. In this regard, the second material layer 20 may be referred to as an oxygen exchange layer. The second material layer 20 may be formed of a second metal oxide, which may be same group as, or different group from, the first metal oxide. For example, the second metal oxide may contain at least one of Ta oxide, Zr oxide, YSZ, Ti oxide, Hf oxide, Mn oxide, Mg oxide, and a mixture thereof. The second metal oxide may have a stoichiometric composition, or a similar composition thereto. For example, when the second metal oxide includes a Ta oxide, the Ta oxide may be a $Ta_2O_5$ layer, or a layer having a composition similar to $Ta_2O_5$. Similar to the first material layer 10, the second material layer 20 may contain oxygen ions and/or oxygen vacancies. Oxygen mobility (or oxygen diffusivity) of the second material layer 20 may be equal to, or greater than, that of the first material layer 10.

Resistivity of the second material layer 20 may differ from that of the first material layer 10. For example, the resistivity of the second material layer 20 may be greater than that of the first material layer 10. In the ON state in which a current path is formed in the second material layer 20, the electric resistance of the memory layer M1 may be determined by the electric resistance of the first material layer 10. In the OFF state in which no current path exists in the second material layer 20, the electric resistance of the memory layer M1 may be determined by the electric resistance of the second material layer 20. Oxygen concentration of the second material layer 20 may be higher than that of the first material layer 10. However, in certain cases, the oxygen concentration of the second material layer 20 may not be higher than that of the first material layer 10. In a case where the second material layer 20 is formed of the same metal oxide as the first material layer 10, the oxygen concentration of the second material layer 20 may be higher than that of the first material layer 10. However, in a case where the second material layer 20 is formed of a metal oxide different from that of the first material layer 10, the oxygen concentration of the second material layer 20 is not necessarily higher than that of the first material layer 10.

The thickness of the second material layer 20 may be from about 1 nm to about 50 nm, for example, from about 5 nm to about 20 nm. The thickness of the second material layer 20 may be smaller than that of the first material layer 10. According to material properties of the second material layer 20 (i.e., the oxygen exchange layer), the resistance change characteristics of the memory element ME1 (e.g., switching speed, ON/OFF ratio, etc.) may vary.

The auxiliary layer A1 may be a resistive layer. In other words, the auxiliary layer A1 may be a layer containing a desired (or, alternatively, predetermined) resistive material. Furthermore, the auxiliary layer A1 may contain a material which contacts the memory layer M1 and induces desired (or, alternatively, predetermined) changes in properties (memory characteristics) of the memory layer M1. For example, the auxiliary layer A1 may contain an oxide. In detail, the auxiliary layer A1 may contain silicon oxide. In this case, the auxiliary layer A1 may be a $SiO_x$ layer (where $0<x\leq2$). The auxiliary layer A1 may provide a multi-bit memory characteristic to the memory layer M1. In a case where the auxiliary layer A1 is not provided, the memory layer M1 may have a single-bit memory characteristic, and the memory layer M1 may exhibit a multi-bit memory characteristic when the auxiliary layer A1 is provided. In other words, the auxiliary layer A1 may function so that the memory layer M1 has a multi-bit memory characteristic. The auxiliary layer A1 may have a suitable thickness to allow the flow of electric current. For example, the thickness of the auxiliary layer A1 may be less than, or equal to, about 10 nm. In a case where the auxiliary layer A1 has an excessive thickness, insulation properties of the auxiliary layer A1 may undesirably increase.

The buffer layer B1 may improve reliability, reproducibility, and stability of resistance change characteristics of the memory layer M1. The buffer layer B1 may contain a material with greater interatomic bonding energy than the memory layer M1. In other words, the interatomic bonding energy of the buffer layer B1 may be greater than the interatomic (e.g., Ta—O) bonding energy of the first material layer 10. In other words, the buffer layer B1 may be formed of a material that is more stable than the memory layer M1 in terms of bonding energy. Furthermore, the buffer layer B1 may contain a material which raises the potential barrier between the first electrode E1 and the memory layer M1. In other words, a conduction band offset between the buffer layer B1 and the first electrode E1 may be greater than that between the first material layer 10 and the first electrode E1. In other words, the buffer layer B1 may be formed of a material that suppresses an excessive current flow between the first electrode E1 and the first material layer 10. In order to get a similar effect, the buffer layer B1 may contain a material with a higher resistivity than the memory layer M1. For example, the buffer layer B1 may contain at least one of $AlO_x$, $SiO_x$, $SiN_x$, $ZrO_x$, $HfO_x$, and a mixture thereof. The buffer layer B1 may, or may not, have a stoichiometric composition. The buffer layer B1 may have a suitable composition and thickness to function as a buffer and to allow flow of electric current. The thickness of the buffer layer B1 may be less than, or equal to about 10 nm, for example. If the buffer layer B1 has a stoichiometric composition, the thickness of the buffer layer B1 may be less than, or equal to, about 5 nm. If the buffer layer B1 has an excessive thickness, insulation properties of the buffer layer B1 may undesirably increase. Therefore, as described above, the buffer layer B1 may be formed to have a thickness less than, or equal to, about 10 nm.

The auxiliary layer A1 may not only induce a multi-bit memory characteristic as described above, but also function similar to the buffer layer B1. In other words, the auxiliary layer A1 may suppress excessive current flow and undesired physical/chemical reactions between the memory layer M1 and the second electrode E2. In this regard, the auxiliary layer A1 may also be considered as a "buffer layer". However, in the present embodiment, the auxiliary layer A1 is a layer that provides a multi-bit memory characteristic to the memory layer M1 as described above, and the function as a buffer layer is optional.

The first electrode E1 may be formed of a base metal (e.g., W, Ni, Al, Ti, Ta, TiN, TiW, TaN, etc.), or a conductive oxide (e.g., indium zinc oxide (IZO), indium tin oxide (ITO), etc.). Because the buffer layer B1 is provided in the present embodiment, stable memory properties may be acquired without forming the first electrode E1 of an expensive noble metal. In a case where the first electrode E1 is formed of an expensive noble metal with low reactivity, the buffer layer B1 may not be necessary, but manufacturing costs increase. Furthermore, even if the first electrode E1 is formed of a noble metal, it may be difficult to secure reproducibility/stability of the resistance change characteristics. According to the present example embodiment, reproducibility/stability of resistance change characteristics may be easily acquired even if the first electrode E1 is formed of an inexpensive material because the buffer layer B1 is used. However, the present example embodiment is not limited thereto. If desired, the first electrode E1 may be formed of noble metals (e.g., Ir, Ru, Pd, Au, Pt, etc.), or metal oxides (e.g., $Ir_2$). Therefore, the first electrode E1 may contain at least one selected from a group consisting of W, Ni, Al, Ti, Ta, TiN, TiW, TaN, IZO, ITO, Ir, Ru, Pd, Au, Pt, and $IrO_2$. Furthermore, although not stated herein, the first electrode E1 may be formed of various electrode materials commonly used in semiconductor devices.

Similar to the first electrode E1, the second electrode E2 may be formed of various materials. For example, the second electrode E2 may be formed of a noble metal (e.g., Ir, Ru, Pd, Au, and Pt), a metal oxide (e.g., $IrO_2$), a non-noble metal (i.e., a base metal) (e.g., W, Ni, Al, Ti, Ta, TiN, TiW, and TaN), or a conductive oxide (e.g., IZO and ITO). Because the auxiliary layer A1 interposed between the second electrode E2 and the memory layer M1 may function as a buffer layer, stable memory properties may be acquired without forming the second electrode E2 of an expensive noble metal. However, materials constituting the second electrode E2 are not limited to the above-stated materials.

Hereinafter, referring to FIGS. 2A and 2B, the resistance changing mechanism of the memory element according to the example embodiment is described in detail.

Figure 2A:
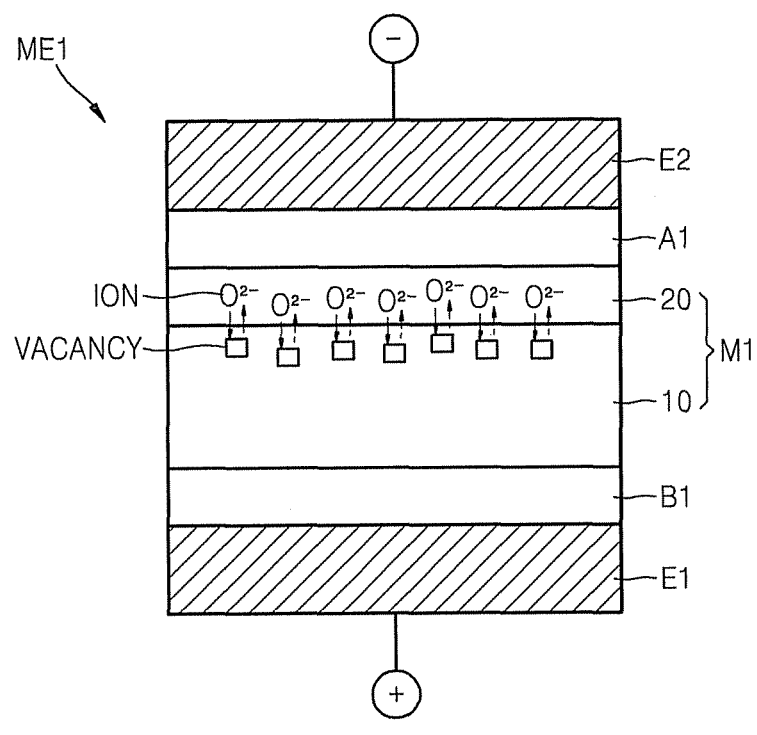
FIGS. 2A and 2B are sectional views for describing resistance changing mechanism of the memory element according to the example embodiment.
Figure 2B:
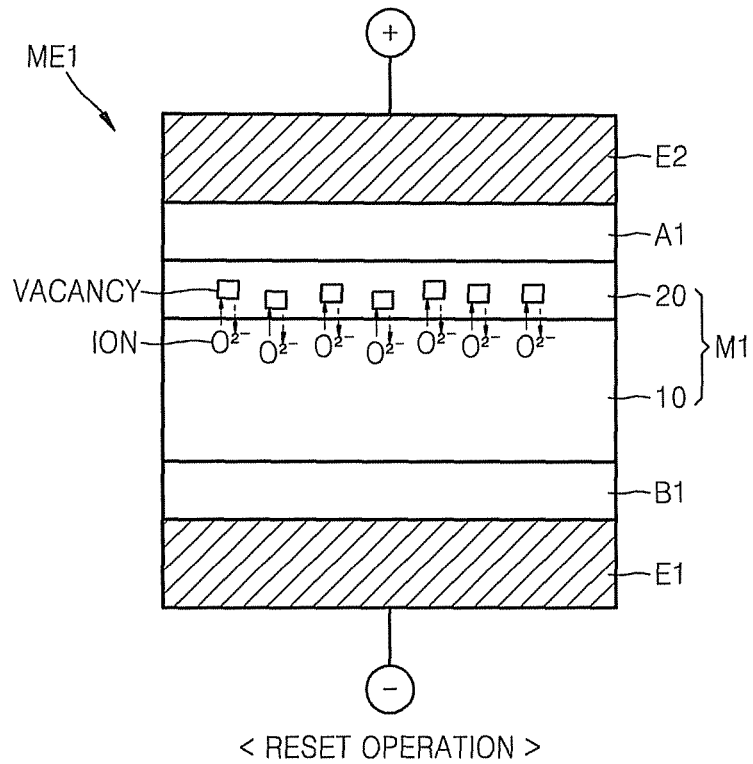

FIGS. 2A and 2B are sectional views for describing resistance changing mechanism of the memory element according to the example embodiment.

As shown in FIG. 2A, during a set operation in which a positive (+) voltage is applied to the first electrode E1 and a negative (−) voltage is applied to the second electrode E2, oxygen vacancies move from the first material layer 10 to second material layer 20, and thus a current path (not shown) may be formed in the second material layer 20. As a result, the electric resistance of the memory layer M1 may decrease. In other words, the memory layer M1 may be switched from an OFF state to an ON state. During the set operation, oxygen ions may move in a direction opposite to the direction in which the oxygen vacancies move (i.e., from the second material layer 20 to the first material layer 10).

As shown in FIG. 2B, during a reset operation in which a negative (−) voltage is applied to the first electrode E1 and a positive (+) voltage is applied to the second electrode E2, oxygen vacancies move from the second material layer 20 to first material layer 10 (i.e., oxygen ions move from the first material layer 10 to the second material layer 20), and thus the current path formed in the second material layer 20 may be broken. As a result, the electric resistance of the memory layer M1 may increase. In other words, the memory layer M1 may be switched from an ON state to an OFF state.

As described above, the auxiliary layer A1 may provide a multi-bit memory characteristic to the memory layer M1. In other words, the resistance state of the memory layer M1 may be divided into a plurality of states by the auxiliary layer A1 (e.g., four states or more). Effects of the auxiliary layer A1 will be described in more detail with reference to FIGS. 4 through 6.

The buffer layer B1 may improve stability, reliability, and reproducibility of resistance change characteristics of the memory element ME1 during the set/reset operations. In a case where the buffer layer B1 is not provided, oxygen ions and/or oxygen vacancies affecting resistance changes during the set/reset operations may move toward the first electrode E1 and physically/chemically react with the first electrode E1, or the memory layer M1 itself may physically/chemically react with the first electrode E1. As a result, there may be problems in stability, reliability, and reproducibility of the resistance change characteristics. For example, a current between the first electrode E1 and the memory layer M1 may rapidly and undesirably increase. Furthermore, due to a reaction between the memory layer M1 and the first electrode E1, an undesired material layer may be formed therebetween, and thus, the characteristics of resistance change may deteriorate. The problems may become more serious in a case where the first electrode E1 is formed of an inexpensive non-noble metal. Furthermore, repetitive switching operations between the ON and OFF states may increase possibilities to have those problems mentioned previously. When a $TaO_x$ layer is used as a resistance changing material, the characteristics of resistance change may vary substantially based on a method of formation, depositing conditions, and oxygen content of the $TaO_x$ layer, and thus it is very difficult to secure reproducibility and stability of the characteristics of resistance change. According to the example embodiments, the problems stated previously, however, may be suppressed/prevented while improving/securing the reliability, reproducibility, and stability of characteristics of resistance change by forming the buffer layer B1 between the first electrode E1 and the memory layer M1. Particularly, during the initial set operation (i.e., the forming operation), the buffer layer B1 may reduce/prevent chemical reactions between the first electrode E1 and the first material layer 10, and between the first electrode E1 and ion species of the first material layer 10. Furthermore, the buffer layer B1 may prevent the first material layer 10 and the first electrode E1 from reacting with each other during formation of the first material layer 10. By introducing the buffer layer B1, the first electrode E1 may not only be formed of a noble metal, but also be formed of an inexpensive non-noble metal or a conductive oxide. Without the buffer layer B1, it may be practically difficult to form the first electrode E1 of a non-noble metal with high reactivity, or a conductive oxide. The use of a noble metal for the first electrode E1 may increase the cost of fabrication and place some limitations in the fabrication process of a memory element. When the first electrodes E1 is formed of a non-noble metal, or a conductive oxide, instead of a noble metal, the costs associated with fabrication of the memory element may decrease and there may be further merits in the fabrication process.

In some cases, the auxiliary layer A1 may also function similarly as the buffer layer B1. In this case, the auxiliary layer A1 may prevent chemical reactions between the second electrode E2 and the second material layer 20, and between the second electrode E2 and ion species of the second material layer 20. For example, the auxiliary layer A1 may suppress/prevent an excessive amount of oxygen vacancies from moving toward the second electrode E2 during a set operation. However, the function of the auxiliary layer A1 as a buffer layer is optional. According to a material constituting the second electrode E2, the auxiliary layer A1 may not function as a buffer layer.

In the structure shown in FIG. 1, at least one of the auxiliary layer A1 and the memory layer M1 may be doped with a metal. An example thereof is shown in FIG. 3.

Figure 3:
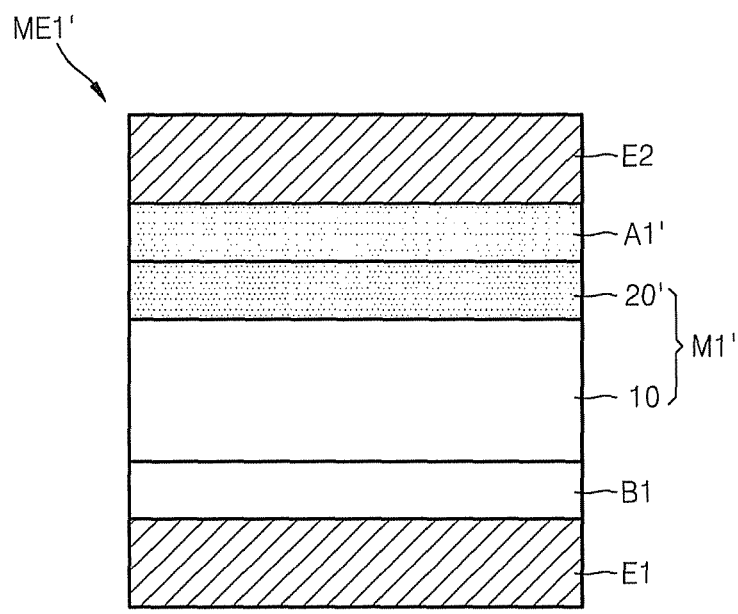
FIG. 3 is a sectional view of a memory element according to yet another example embodiment.

FIG. 3 is a sectional view of a memory element according to yet another example embodiment.

Referring to FIG. 3, an auxiliary layer A1' may be doped with a desired (or, alternatively, predetermined) metal. Furthermore, at least a portion of a second material layer 20' may be doped with a desired (or, alternatively, predetermined) metal. For example, the auxiliary layer A1' and the second material layer 20' may be doped with tungsten (W). As such, in a case where the auxiliary layer A1' and at least a portion of a memory layer M1' are doped with a metal (e.g., W), the operating voltage of a memory element ME1' may be lowered. The reason may be that electric resistances of the auxiliary layer A1' and the memory layer M1' decrease as they are doped with the metal (e.g., W). If the operating voltage of the memory element ME1' is lowered, power consumption of the memory element ME1' may be reduced.

Although FIG. 3 shows a case in which the auxiliary layer A1' and the second material layer 20' are doped with a metal, it is merely an example. In other embodiments, only one of the auxiliary layer A1' and the second material layer 20' may be doped with a metal. Alternatively, at least a portion of the first material layer 10 may be doped with a metal. Various materials other than tungsten (W) may be used as the doping metal.

Figure 4:
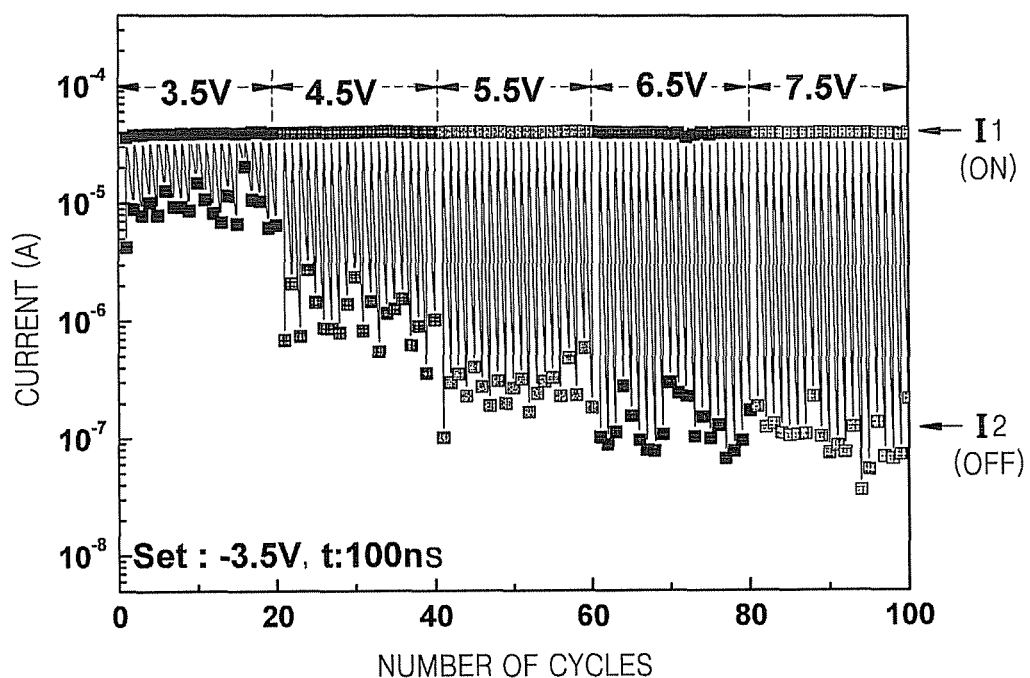
FIG. 4 is a graph showing changes of ON and OFF currents of a memory element according to the example embodiment for various switching conditions.

FIG. 4 is a graph showing changes of ON and OFF currents of a memory element according to the example embodiment for various switching conditions.

The memory element used to acquire the result shown in FIG. 4 has a structure of $W/Al_2O_3/TaO_x/Ta_2O_5/SiO_x/Pt$. In other words, the memory element has the structure shown in FIG. 1, where the first electrode E1, the buffer layer B1, the first material layer 10, the second material layer 20, the auxiliary layer A1, and the second electrode E2 are formed of W, $Al_2O_3$, $TaO_x$, $Ta_2O_5$, $SiO_x$, and Pt, respectively. Changes of ON/OFF currents are measured by setting a reset voltage to 3.5 V, 4.5 V, 5.5 V, 6.5 V, and 7.5 V. A set voltage was −3.5 V, and a period of time for application per voltage pulse (pulse width) is 100 ns. In FIG. 4, a high current level $I_1$ indicates an ON current level, whereas a low current level $I_2$ indicates an OFF current level.

As shown in FIG. 4, the OFF current level changes according to switching conditions. In other words, various OFF current levels appear according to intensities of a reset voltage. It means that the resistance state of the memory element may vary according to switching conditions. Here, there may be three or more resistive states of the memory element, or four or more resistance states of the memory element. In other words, the memory element may have four or more resistance states respectively corresponding to data "00," "01," "10," and "11." For example, the ON current level may correspond to data "00," the OFF current level in a case where a reset voltage is 3.5 V may correspond to data "01," the OFF current level in a case where a reset voltage is 4.5 V may correspond to data "10," and the OFF current level in a case where a reset voltage is 6.5 V may correspond to data "11." Therefore, the memory element according to the present example embodiment may have multi-bit memory characteristic. The correspondences between current levels and data stated above are merely examples and may vary.

Figure 5:
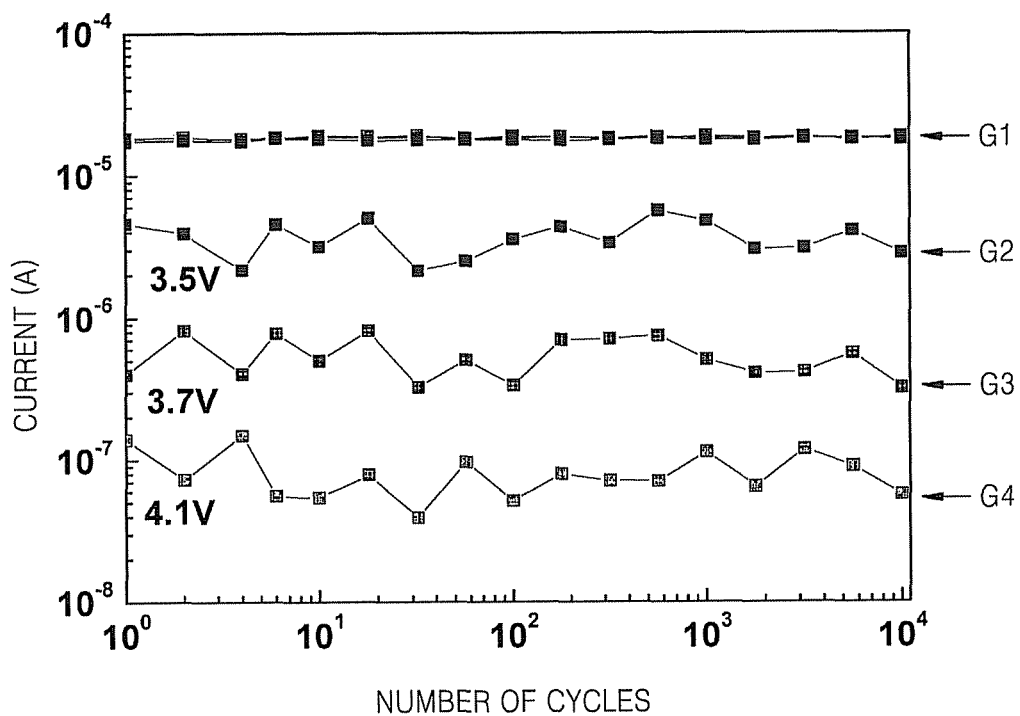
FIG. 5 is a graph showing changes of ON and OFF currents of a memory element according to the yet another example embodiment where the number of switching operations per switching condition varies.

FIG. 5 is a graph showing changes of ON and OFF currents of a memory element according to another example embodiment where the number of switching operations per switching condition varies.

The memory element used to acquire the result shown in FIG. 5 has a structure of $W/Al_2O_3/TaO_x/Ta_2O_5/SiO_x/Pt$. In other words, the memory element has the structure shown in FIG. 3, where the first electrode E1, the buffer layer B1, the first material layer 10, the second material layer 20', the auxiliary layer A1', and the second electrode E2 are formed of W, $Al_2O_3$, $TaO_x$, $Ta_2O_5$, $SiO_x$, and Pt, respectively. Here, the $Ta_2O_5$ layer used as the second material layer 20' and the $SiO_x$ layer used as the auxiliary layer A1' are doped with tungsten (W). Changes of ON/OFF currents are measured by repeatedly performing switching operations of the memory element up to $10^4$ times by using reset voltages of 3.5 V, 3.7 V, and 4.1 V. A first graph G1 indicates ON current, a second graph G2 indicates OFF current in a case where a reset voltage is 3.5 V, a third graph G3 indicates OFF current in a case where a reset voltage is 3.7 V, and a fourth graph G4 indicates OFF current in a case where a reset voltage is 4.1 V.

As shown in FIG. 5, current levels of the four graphs (namely, the first to fourth graphs G1 through G4), show clear differences without overlapping each other. Therefore, a multi-bit memory characteristic of the memory element is stably maintained even if switching operations (i.e., ON/OFF operations), are repeatedly performed $10^4$ times. Here, the first graph G1 may correspond to data "00," the second graph G2 may correspond to data "01," the third graph G3 may correspond to data "10," and the fourth graph G4 may correspond to data "11." As such, the memory element according to the present example embodiment may have a multi-bit memory characteristic that may be continuously maintained.

Comparing FIG. 4 and FIG. 5, a reset voltage of about 4.5 V is necessary to acquire a current level of about $10^{-6}$ A in FIG. 4, whereas a reset voltage below or equal to 3.7 V is necessary to acquire a current level of about $10^{-6}$ A in FIG. 5. Therefore, the operating voltage of the memory element of FIG. 5 is lower than the operating voltage of the memory element of FIG. 4. Compared to the memory element of FIG. 4, the second material layer 20' and the auxiliary layer A1' are doped with a metal (W) in the memory element of FIG. 5, and thus it is clear that an operating voltage may be lowered due to the doped metal.

Figure 6:
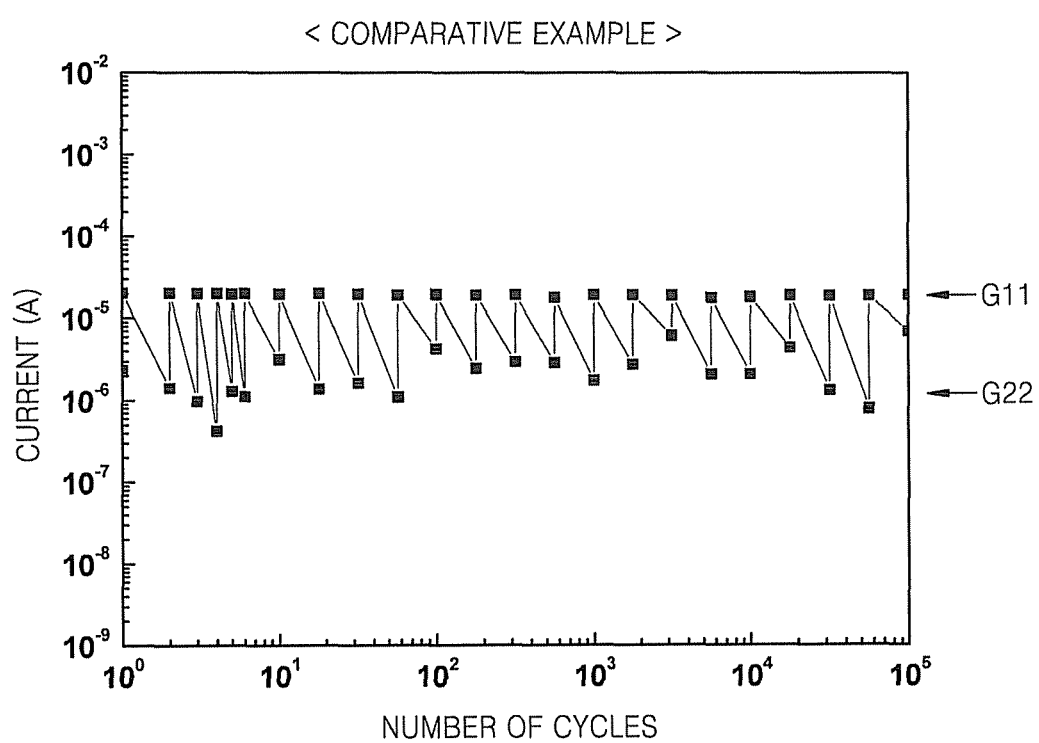
FIG. 6 is a graph showing changes of ON and OFF currents with respect to the number of switching operations of a memory element according to a comparative example.

FIG. 6 is a graph showing changes of ON and OFF currents with respect to the number of switching operations of a memory element according to a comparative example.

The memory element used to acquire the result shown in FIG. 6 has a structure of $W/Al_2O_3/TaO_x/Ta_2O_5/Pt$. In other words, the memory element according to the comparative example is identical to the memory element of FIG. 4, except that the memory element according to the comparative example has no auxiliary layer ($SiO_x$ layer). In FIG. 6, a first graph G11 indicates ON current, whereas a second graph G22 indicates OFF current.

As shown in FIG. 6, the memory element according to the comparative example (i.e., a memory element without an auxiliary layer according to example embodiments), has only two resistance states. In other words, the memory element according to the comparative example has a single-bit memory characteristic.

Referring to FIGS. 4 through 6, a memory element according to example embodiments may have a multi-bit memory characteristic due to an auxiliary layer, and the multi-bit memory characteristic may be continuously maintained. Furthermore, if an auxiliary layer and at least a portion of a memory layer are doped with a metal (e.g., W), the operating voltage of the memory element may be lowered.

Memory elements according to example embodiments, as described above, may be applied to memory devices with various structures. Here, a memory device may further include a switching device connected to the memory element.

Figure 7:
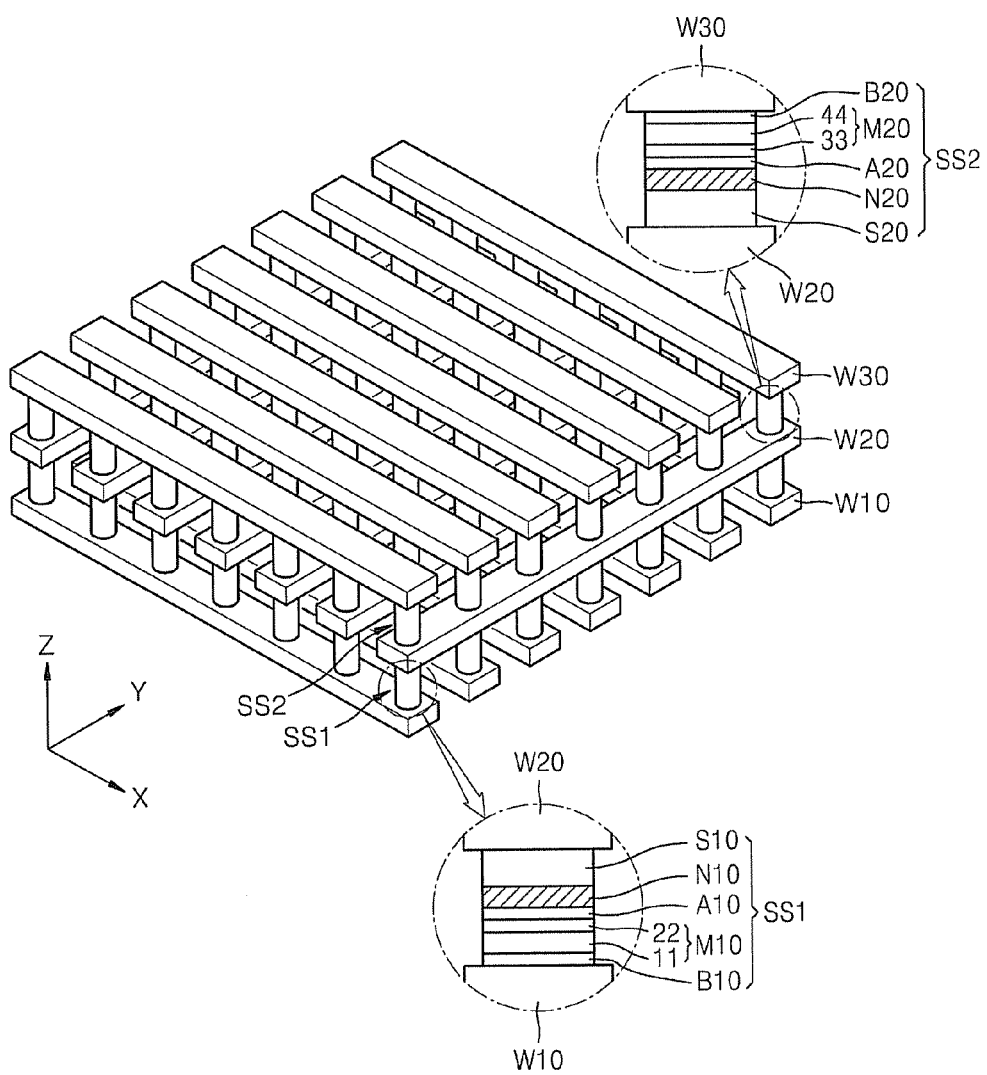
FIG. 7 is a perspective view of a memory device which comprises a memory element according to another example embodiment.

FIG. 7 is a perspective view of a memory device which comprises a memory element according to another example embodiment.

The memory device illustrated in FIG. 7 is a cross-point resistive memory device.

Referring to FIG. 7, a plurality of first wires W10 are formed parallel to each other in a first direction (e.g., the x-axis direction). A plurality of second wires W20 are formed in a direction crossing (or intersecting) the first wires W10 (e.g., the y-axis direction). The second wires W20 may be substantially perpendicular to the first wires W10. A first stacked structure (first memory cell) SS1 may be arranged at a point where one of the first wires W10 and one of the second wires W20 cross each other. The first stacked structure SS1 may include a first buffer layer B10, a first memory layer M10, a first auxiliary layer A10, a first intermediate electrode N10, and a first switching element S10 that are stacked on the first wires W10 in the order stated. The first memory layer M10 may include a first material layer 11 and a second material layer 22. In the first stacked structure SS1, locations of the lower structure including B10+M10+A10 and the upper structure including S10 may be switched around the first intermediate electrode N10. That is, the upper structure may comprise of B10+M10+A10, the lower structure may comprise of S10, and the first intermediate electrode N10 may be interposed between the upper and lower structures.

The first buffer layer B10, the first memory layer M10, and the first auxiliary layer A10 may either respectively correspond to the buffer layer B1, the memory layer M1, and the auxiliary layer A1 of FIG. 1. or respectively correspond to the buffer layer B1, the memory layer M1', and the auxiliary layer A1' of FIG. 3. The first switching element S10 may be formed of a two-way diode, a threshold switching device, a varistor, or the like. In a case where the first switching element S10 is a two-way diode, the two-way diode may be an oxide diode. In a case of a silicon diode, it is necessary to form the silicon diode at a relatively high temperature around 800° C., and thus there are limits to selectable substrates. Furthermore, various problems may occur due to the high temperature. Therefore, various advantages may be acquired by forming the first switching element S10 by using an oxide layer that is easily formed at room temperature. However, the present invention is not limited thereto. If desired, the first switching element S10 may be formed of silicon or any of various other materials. The first wires W10 and the first intermediate electrode N10 may correspond to the first electrode E1 and the second electrode E2 of FIG. 1, respectively. The second wires W20 may, or may not, be formed of the same material as the first wires W10.

Third wires W30 may be further disposed at a selected (or, alternatively, predetermined) space apart from the top surfaces of the second wires W20. The third wires W30 may cross (or intersect) the second wires W20, and may be arranged apart from each other by the same interval (or equal distance). The third wires W30 may be substantially perpendicular to the second wires W20. A second stacked structure (second memory cell) SS2 may be arranged at a point where one of the second wires W20 and one of the third wires W30 cross each other. The second stacked structure SS2 may have a reverse structure of the first stacked structure SS1, or the same structure as the first stacked structure SS1. Here, a case where the second stacked structure SS2 has the reverse structure of the first stacked structure SS1 is shown. In detail, the second stacked structure SS2 may include a second switching element S20, a second intermediate electrode N20, a second auxiliary layer A20, a second memory layer M20, and a second buffer layer B20 that are stacked on the second wires W20 in the order stated. The second memory layer M20 may include a third material layer 33 and a fourth material layer 44. The third material layer 33 and the fourth material layer 44 may respectively be the same material layers as the second material layer 22 and the first material layer 11. The second switching element S20 may have a reverse structure of the first switching element S10, or may have the same stacked structure as the first switching element S10. In other words, switching direction of the second switching element S20 may be opposite from, or the same as, that of the first switching element S10. The second buffer layer B20 may be the same material layer as the first buffer layer B10. In the second stacked structure SS2, locations of the lower structure including S20 and the upper structure including A20+M20+B20 may be switched around the second intermediate electrode N20. The third wires W30 and the second intermediate electrode N20 may respectively correspond to the first electrode E1 and the second electrode E2 of FIG. 1, or to the second electrode E2 and the first electrode E1.

Although the first and second stacked structures SS1 and SS2 are shown having a cylindrical shape in FIG. 7, the first and second stacked structures SS1 and SS2 may have other various shapes. For example, the first and second stacked structures SS1 and SS2 may have a square pillar shape, or a conical pillar shape in which width increases downward. The first and second stacked structures SS1 and SS2 may have asymmetrical shapes. For example, the first and/or second stacked structures may have a section whose cross sectional area is larger than an area of the cross-points formed by the neighboring wirings (e.g., W10 and W20, or W20 and W30). It is also possible that the first and/or second stacked structure may have a portion whose center is off from the center of the cross-point formed by the neighboring wirings. The shape of the memory device shown in FIG. 7 may further be modified within the spirit and scope.

Although not shown, the resistive memory device shown in FIG. 7 may further include a stacked structure, which is the same as the stacked structure including the first stacked structures SS1 and the second wires W20, on the third wires W30.

Alternatively, a resistive memory device according to an example embodiment may include at least one set of a stacked structure, which is the same as the stacked structure including the first stacked structures SS1, the second wires W20, the second stacked structures SS2, and the third wires W30, on the third wires W30.

Alternatively, a resistive memory device according to an example embodiment may include at least one set of a stacked structure, which is the same as the stacked structure including the first stacked structures SS1, the second wires W20, the second stacked structures SS2, the third wires W30, the first stacked structures SS1, and the second wires W20 sequentially stacked, on the third wires W30.

In the memory device shown in FIG. 7, the first memory layer M10 may have a multi-bit memory characteristic due to the first auxiliary layer A10, and the second memory layer M20 may have a multi-bit memory characteristic due to the second auxiliary layer A20. The reason therefor is as described above with reference to FIGS. 1 through 6, and thus a detailed description thereof is omitted for the sake of brevity. Furthermore, in a case where the first memory layer M10 and/or at least a portion of the first auxiliary layer A10 are doped with a metal (e.g., W), the operating voltage of the first memory layer M10 may be lowered. In the same regard, in a case where the second memory layer M20 and/or at least a portion of the second auxiliary layer A20 are doped with a metal, the operating voltage of the second memory layer M20 may be lowered. Because it is described above with reference to FIGS. 4 and 5 that an operating voltage is lowered due to a doped metal, a detailed description thereof is omitted for the sake of brevity.

Accordingly, memory devices according to example embodiments have a multi-bit memory characteristic, and thus, it may be easy to increase the amount of information stored per unit area. In other words, memory devices according to example embodiments may be suitable for embodying a highly-integrated memory device. In a case of a scale-down method by reducing line width of a memory device, there are various difficulties in increasing integration degree of the memory device due to process limits. However, as in example embodiments, if multi-bit data is stored in a single memory cell, the amount of information stored per unit area may be twice or more than a single-bit memory. Therefore, example embodiments may be suitable for increasing the integration degree of a memory device.

Hereinafter, methods of manufacturing a memory element according to example embodiments, and memory devices including the memory elements are described.

FIGS. 8A through 8G are sectional views showing a method of manufacturing a memory device according to still another example embodiment.

Figure 8A:
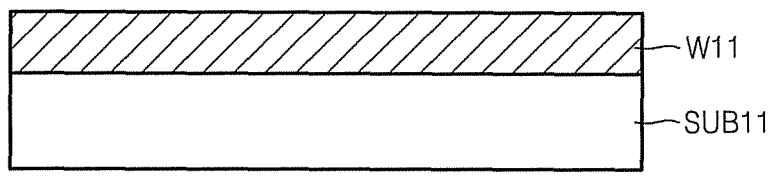
FIGS. 8A through 8G are sectional views showing a method of manufacturing a memory device according to still another example embodiment.

Referring to FIG. 8A, a first wire W11 may be formed on a substrate SUB11. The first wire W11 may have a linear shape. Although not shown, an insulation layer having the same height as the first wire W11 may further be formed on the substrate SUB11 around the first wire W11. The first wire W11 may correspond to the first electrode E1 of FIG. 1, or the first wire W10 of FIG. 7. The shape of the first wire W11 is not limited to a linear shape and may vary.

Figure 8B:
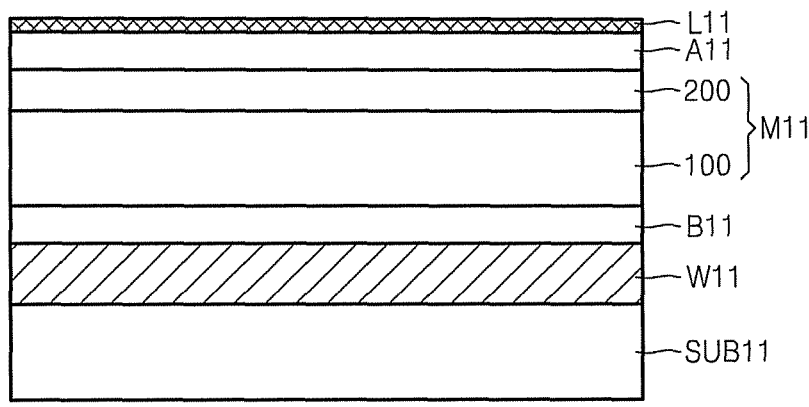

Referring to FIG. 8B, a buffer layer B11, a memory layer M11, and an auxiliary layer A11 may be formed on the first wire W11 in the order stated. The memory layer M11 may include a first material layer 100 and a second material layer 200. A material constituting the buffer layer B11 may correspond to a material constituting the buffer layer B1 of FIG. 1, and materials constituting the first and second material layers 100 and 200 may correspond to materials constituting the first and second material layers 10 and 20 of FIG. 1, respectively. A material constituting the auxiliary layer A11 may correspond to a material constituting the auxiliary layer A1 of FIG. 1. A desired (or, alternatively, predetermined) metal layer L11 may be formed on the auxiliary layer A11. The metal layer L11 may be formed of tungsten (W), for example. In other words, the metal layer L11 may be a tungsten (W) layer. The thickness of the metal layer L11 may be about several nm. For example, the thickness of the metal layer L11 may be about 2 nm.

Figure 8C:
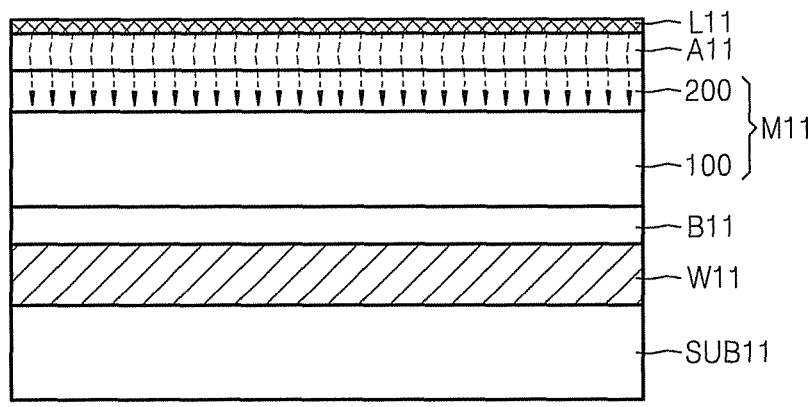
Figure 8D:
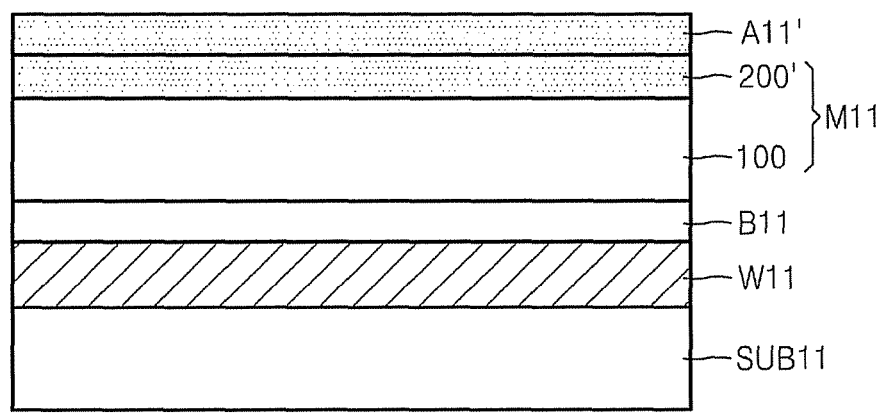

Referring to FIG. 8C, the stacked structure (W11+B11+M11+A11+L11) formed on the substrate SUB11 may be annealed. The annealing may be performed at several hundreds degrees Celsius (° C.). For example, the annealing may be performed at a temperature from about 300° C. to about 400° C. As a result, metal atoms (e.g., tungsten atoms) of the metal layer L11 may diffuse into the auxiliary layer A11 and the memory layer M11. As a result, as shown in FIG. 8D, the auxiliary layer A11 and the second material layer 200 may be doped with the metal atoms (e.g., tungsten atoms) to form a doped auxiliary layer A11' and a doped second material layer 200'. Because the thickness of the metal layer L11 that is formed in the operation shown in FIG. 8B is relatively thin, most of atoms of the metal layer L11 may be spread by the annealing. Thus, no metal layer L11 may remain on the auxiliary layer A11 as shown in FIG. 8D, after the annealing. However, in certain cases, a portion of the metal layer L11 may remain on the doped auxiliary layer A11'.

Figure 8E:
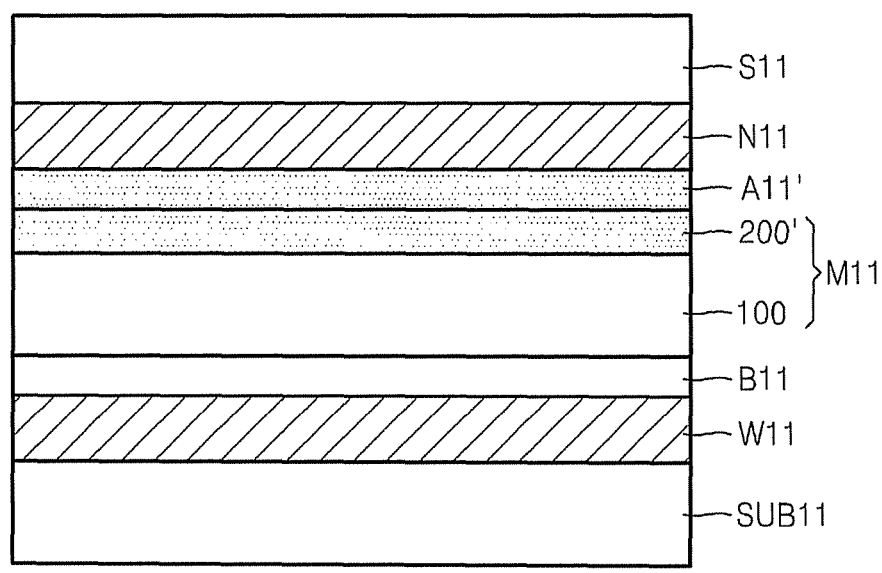

Referring to FIG. 8E, an intermediate electrode N11 may be formed on the doped auxiliary layer A11'. A material constituting the intermediate electrode N11 may correspond to the material constituting the second electrode E2 of FIG. 1, or the first intermediate electrode N10 of FIG. 7. A switching element S11 may be formed on the intermediate electrode N11. The switching element S11 may correspond to the first switching element S10 of FIG. 7.

Then, the switching element S11, the intermediate electrode N11, the doped auxiliary layer A11', the memory layer M11, and the buffer layer B11 may be patterned to form a stacked structure SS11. A result thereof is shown in FIG. 8F.

Figure 8F:
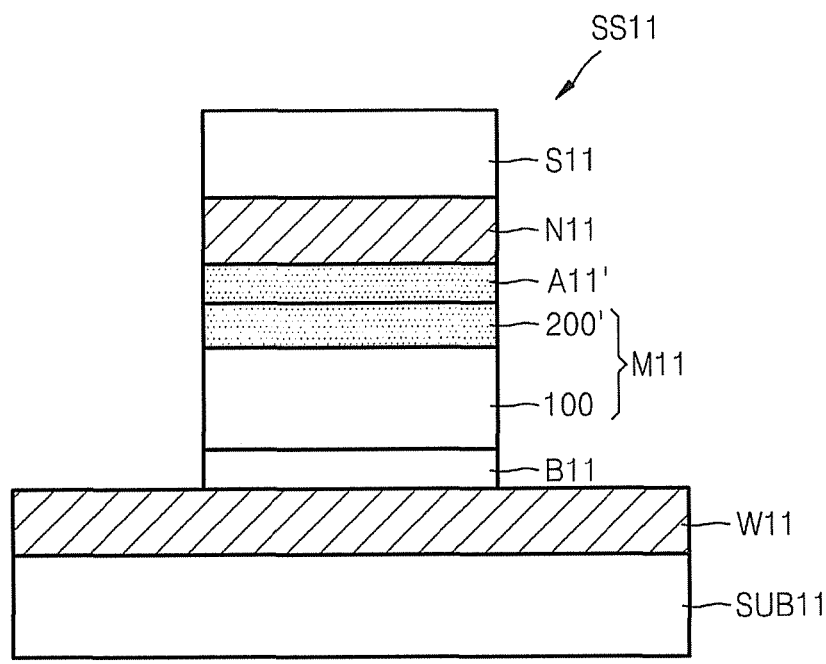

Referring to FIG. 8F, the patterned buffer layer B11, memory layer M11, doped auxiliary layer A11', intermediate electrode N11 and switching element S11 constitute the stacked structure SS11. The stacked structure SS11 may correspond to the first stacked structure SS1 of FIG. 7.

Figure 8G:
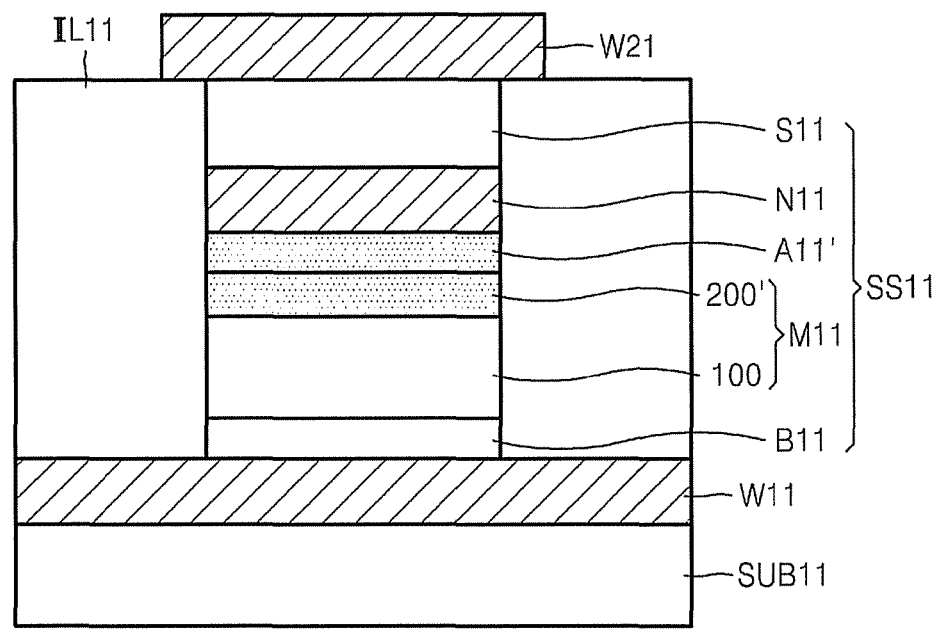

Referring to FIG. 8G, an interlayer insulation layer IL11 may be formed around the stacked structure SS11. The interlayer insulation layer IL11 may have a thickness similar, or the same, as that of the stacked structure SS11. Then, the second wire W21 may be formed on the stacked structure SS11 and the interlayer insulation layer IL11. The second wire W21 may have a linear shape. The second wire W21 may extend in a direction crossing the first wire W11. Although not shown, an insulation layer having the same height as the second wire W21 may further be formed around the second wire W21. The second wire W21 may correspond to the second wires W20 of FIG. 7. The shape of the second wire W21 is not limited to a linear shape and may vary.

The manufacturing method shown in FIGS. 8A through 8G is merely an example, and various modifications may be made thereto. For example, the thickness and annealing condition of the metal layer L11 may be controlled such that only the auxiliary layer A11 is doped with a metal, and the second material layer 200 is not doped with the metal. Furthermore, the metal doping method may be replaced with a method other than the formation and annealing of the metal layer L11. If desired, at least a portion of the second material layer 200 may be doped with a metal, whereas the auxiliary layer A11 may not be doped with the metal. Alternatively, at least a portion of the first material layer 100 may be doped with a metal. Alternatively, the metal doping operation may be omitted. In other words, the formation and annealing of the metal layer L11 shown in FIGS. 8B and 8C may not be performed. Various other modifications may be also made thereto.

FIGS. 9A through 9G are sectional views showing a method of manufacturing a memory device according to still yet another example embodiment.

Figure 9A:
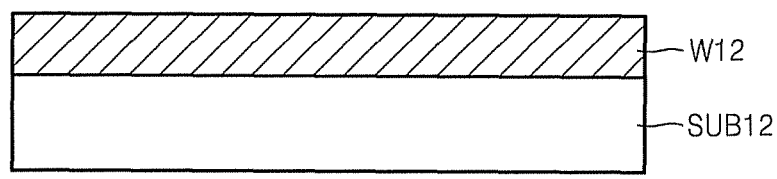
FIGS. 9A through 9G are sectional views showing a method of manufacturing a memory device according to still yet another example embodiment.

Referring to FIG. 9A, a first wire W12 may be formed on a substrate SUB12. The first wire W12 may have a linear shape. Although not shown, an insulation layer having the same height as the first wire W12 may further be formed on the substrate SUB12 around the first wire W12.

Figure 9B:
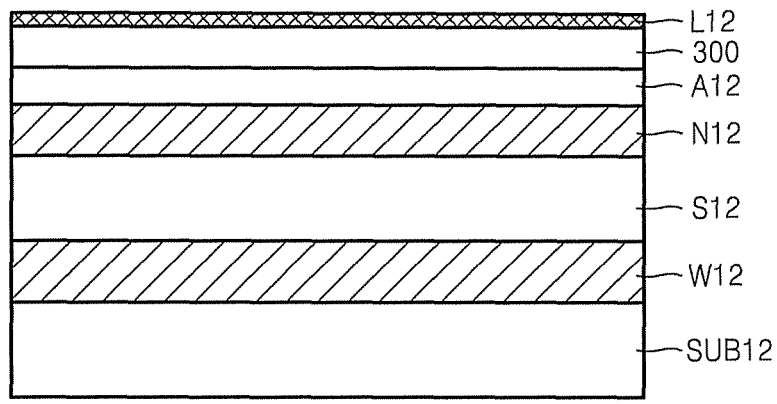

Referring to FIG. 9B, a switching element S12, an intermediate electrode N12, and an auxiliary layer A12 may be formed on the first wire W12 in the order stated, and a third material layer 300 may be formed on the auxiliary layer A12. A material constituting the third material layer 300 may correspond to the material constituting the second material layer 20 of FIG. 1 or the third material layer 33 of FIG. 7. A desired (or, alternatively, predetermined) metal layer L12 may be formed on the third material layer 300. The metal layer L12 may be formed of tungsten (W), for example. The thickness of the metal layer L12 may be about several nm.

Figure 9C:
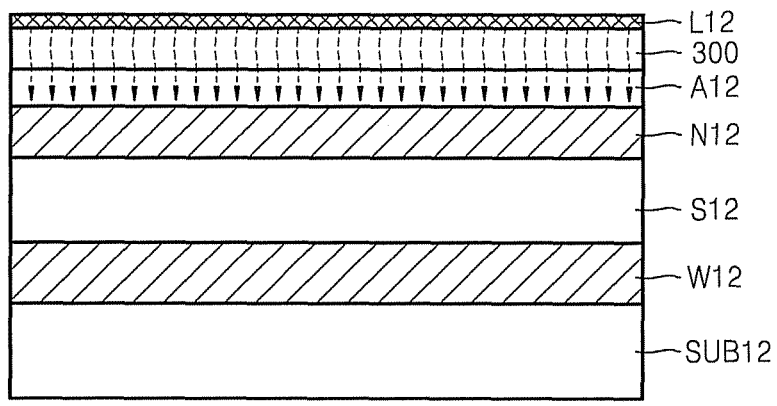
Figure 9D:
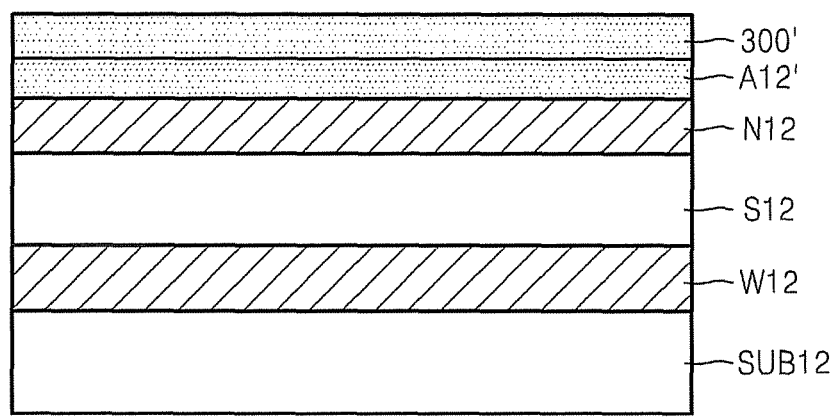

Referring to FIG. 9C, the metal layer L12, the third material layer 300, and the auxiliary layer A12 may be annealed. The annealing may be performed at hundreds of degrees Celsius. For example, the annealing may be performed at a temperature from about 300° C. to about 400° C. As a result, metal atoms (e.g., tungsten atoms) of the metal layer L12 may be diffused into the third material layer 300 and the auxiliary layer A12. As a result, as shown in FIG. 9D, the third material layer 300 and the auxiliary layer A12 may be doped with the metal atoms (e.g., tungsten atoms) to form a doped third material layer 300' and a doped auxiliary layer A12'. Because the thickness of the metal layer L12 that is formed in the operation shown in FIG. 9B is relatively thin, no metal layer L12 may remain on the auxiliary layer A12 after the annealing.

Figure 9E:
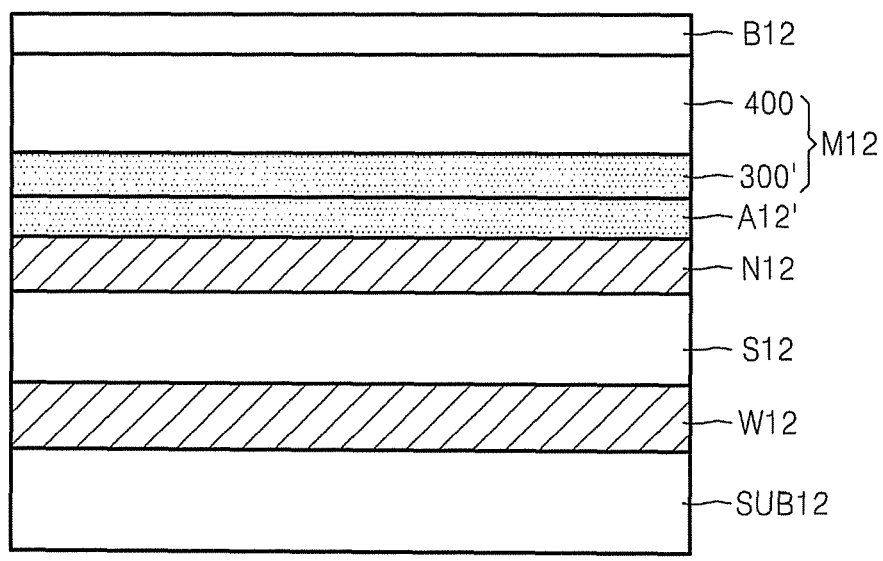

Referring to FIG. 9E, a fourth material layer 400 may be formed on the third material layer 300. The fourth material layer 400 may correspond to the first material layer 10 of FIG. 1, or the fourth material layer 44 of FIG. 7. The third material layer 300 and the fourth material layer 400 may constitute a memory layer M12. A buffer layer B12 may be formed on the fourth material layer 400.

Then, the buffer layer B12, the memory layer M12, the doped auxiliary layer A12', the intermediate electrode N12, and the switching element S12 may be patterned to form a stacked structure SS22. A result thereof is shown in FIG. 9F.

Figure 9F:
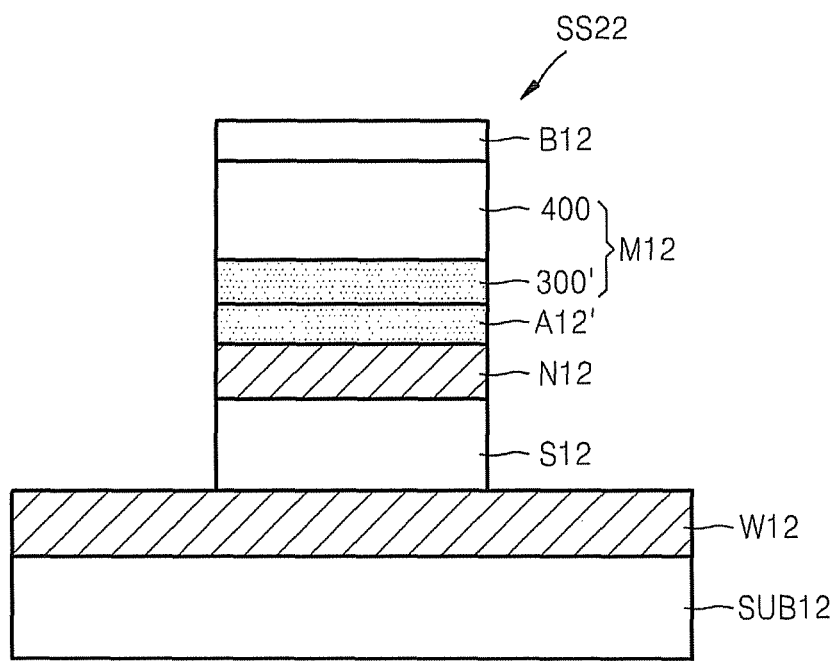

Referring to FIG. 9F, the patterned switching element S12, intermediate electrode N12, doped auxiliary layer A12', memory layer M12, and buffer layer B12 constitute the stacked structure SS22. The stacked structure SS22 may correspond to the second stacked structure SS2 of FIG. 7.

Figure 9G:
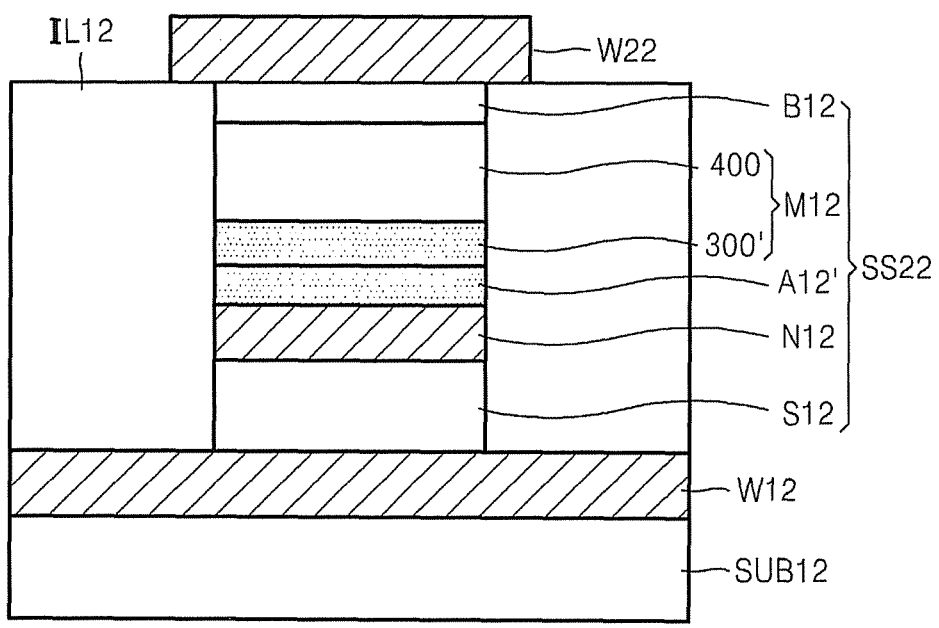

Referring to FIG. 9G, an interlayer insulation layer IL12 may be formed around the stacked structure SS22. The interlayer insulation layer IL12 may have a thickness similar to, or the same as, that of the stacked structure S22. Then, the second wire W22 may be formed on the stacked structure SS22 and the interlayer insulation layer IL12. The second wire W22 may have a linear shape. The second wire W22 may extend in a direction crossing the first wire W12. Although not shown, an insulation layer having the same height as the second wire W22 may further be formed around the second wire W22. The shape of the second wire W22 is not limited to a linear shape and may vary.

The manufacturing method shown in FIGS. 9A through 9G is merely an example, and various modifications may be made thereto. For example, the thickness and annealing condition of the metal layer L12 may be controlled such that only the third material layer 300 is doped with a metal, and the auxiliary layer A12 is not doped with the metal. Furthermore, in the operation shown in FIG. 9B, the metal layer L12 may be formed on the auxiliary layer A12, and an annealing operation may be performed without forming the third material layer 300. In this case, only the auxiliary layer A12 may be doped with a metal, whereas the third material layer 300 may not be doped with a metal. The metal doping method may be replaced with a method other than the formation and annealing of the metal layer L12. If desired, at least a portion of the fourth material layer 400 may be doped with a metal. Alternatively, the metal doping operation may be omitted. In other words, the formation and annealing of the metal layer L12 shown in FIGS. 9B and 9C may not be performed. Various other modifications may be also made thereto.

Figure 10:
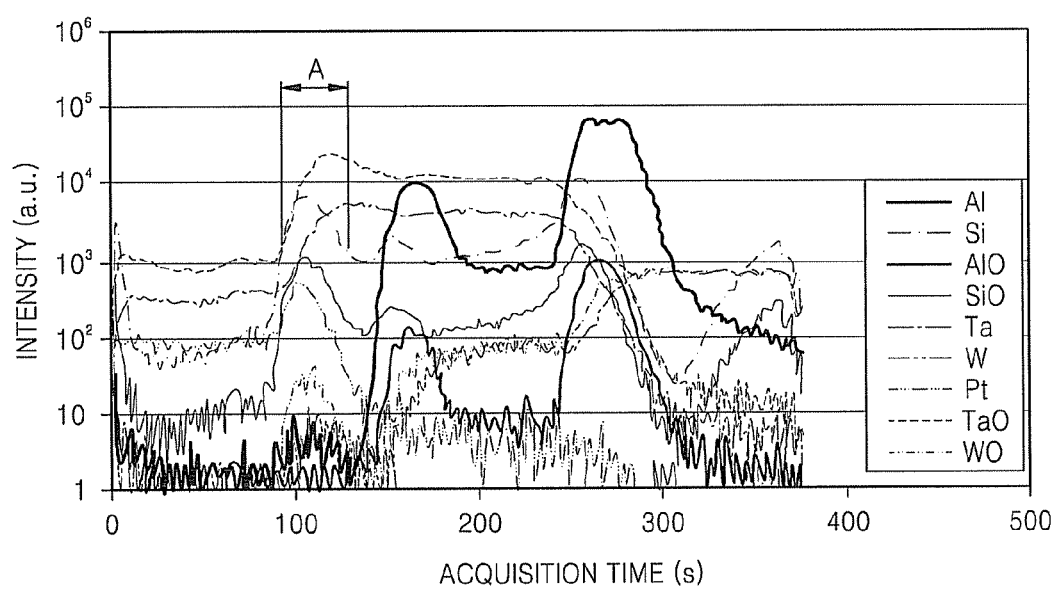
FIG. 10 is a graph showing secondary ion mass spectroscopy (SIMS) data indicating changes of composition of a memory element manufactured according to the still another example embodiment for various acquisition times.

FIG. 10 is a graph showing secondary ion mass spectroscopy (SIMS) data indicating changes of composition of a memory element manufactured according to the still another example embodiment for various acquisition times.

In FIG. 10, the memory element has a structure of W/Al$_2$O$_3$/TaO$_x$/Ta$_2$O$_5$/SiO$_x$/Pt. The structure is manufactured according to the method shown in FIGS. 8A through 8G. In FIG. 10, the x-axis indicates acquisition time (s). The longer the acquisition time, the deeper the measuring depth.

Referring to FIG. 10, a SiO material exists in a region A which corresponds to an auxiliary layer region. Therefore, the memory element according to the present embodiment contains (or includes) SiO$_x$ in the auxiliary layer.

While the embodiments have been particularly shown and described with reference to example thereof, it will be understood by one of ordinary skill in the art that various changes in form and details may be made therein without departing from the spirit and scope of the disclosure as defined by the following claims. For example, one of ordinary skill in the art would understand that at least one additional material layer may be arranged in each of the memory elements shown in FIGS. 1 and 3, and that the memory elements shown in FIGS. 1 and 3 may be applied not only to the cross-point memory device as shown in FIG. 7, but also to any of various other memory devices. Furthermore, one of ordinary skill in the art would understand that example embodiments may be applied to various types of memory devices other than a resistive memory device.

What is claimed is:

1. A memory element, comprising:
  a first electrode;
  a second electrode spaced apart from the first electrode;
  a memory layer between the first electrode and the second electrode, the memory layer including a first material layer and a second material layer; and
  an auxiliary layer between the memory layer and one of the first electrode and the second electrode, the auxiliary layer providing the multi-bit memory characteristic to the memory layer according to exchange of vacancies and ions between the first material layer and the second material layer,
  wherein the memory layer provided with the multi-bit characteristic includes three or more resistance states.

2. The memory element of claim 1, wherein
  the first material layer is an oxygen supplying layer, and
  the second material layer is an oxygen exchange layer.

3. The memory element of claim 1, wherein the first material layer comprises a first metal oxide.

4. The memory element of claim 3, wherein the first metal oxide comprises at least one of tantalum (Ta) oxide, zirconium (Zr) oxide, yttria-stabilized zirconia (YSZ), titanium (Ti) oxide, hafnium (HI) oxide, manganese (Mn) oxide, magnesium (Mg) oxide, and a mixture thereof.

5. The memory element of claim 4, wherein the first metal oxide comprises TaO$_x$ (where 0<x<2.5).

6. The memory element of claim 3, wherein
  the second material layer comprises a second metal oxide, and
  the second metal oxide is the same group as or a different group from the first metal oxide.

7. The memory element of claim 6, wherein the second metal oxide comprises at least one of tantalum (Ta) oxide, zirconium (Zr) oxide, yttria-stabilized zirconia (YSZ), titanium (Ti) oxide, hafnium (Hf) oxide, manganese (Mn) oxide, magnesium (Mg) oxide, and a mixture thereof.

8. The memory element of claim 1, wherein the second material layer has an oxygen concentration higher than that of the first material layer.

9. The memory element of claim 1, wherein
  the first material layer is between the first electrode and the second electrode,
  the second material layer is between the first material layer and the second electrode, and
  the auxiliary layer is between the second material layer and the second electrode.

10. The memory element of claim 1, wherein the auxiliary layer comprises an oxide.

11. The memory element of claim 10, wherein the auxiliary layer is a silicon oxide layer.

12. The memory element of claim 11, wherein the auxiliary layer has a thickness less than, or equal to, about 10 nm.

13. The memory element of claim 10, wherein the auxiliary layer is doped with tungsten (W).

14. The memory element of claim 1, wherein at least a portion of the memory layer is doped with tungsten (W).

15. The memory element of claim 1, further comprising:
  a buffer layer between the first electrode and the memory layer.

16. The memory element of claim 15, wherein the buffer layer includes a material that raises a potential barrier between the first electrode and the memory layer.

17. A memory device, comprising the memory element of claim 1.

18. The memory device of claim 17, further comprising:
  a switching element connected to the memory element.

19. A memory device, comprising:
a plurality of first wires parallel to each other;
a plurality of second wires parallel to each other and crossing the first wires to form a plurality of first cross-points; and
a plurality of first memory cells at the first cross-points, respectively,
each of the memory cells including,
a memory layer between the first wires and the second wires, the memory layer including a first material layer and a second material layer, and
an auxiliary resistive layer between the memory layer and one of the first wire and the second wire and providing the multi-bit characteristic to the memory layer according to exchange of vacancies and ions between the first material layer and the second material layer,
wherein the memory layer provided with the multi-bit characteristic includes three or more resistance states.

20. The memory device of claim 19, wherein each of the memory cells further comprises:
a switching element between the memory layer and the second wires; and
an intermediate electrode between the memory layer and the switching element.

21. The memory device of claim 20, wherein the auxiliary resistive layer is between the memory layer and the intermediate electrode.

22. The memory device of claim 19, wherein
the first material layer is an oxygen supplying layer, and
the second material layer is an oxygen exchange layer.

23. The memory device of claim 19, wherein
the first material layer comprises a first metal oxide,
the second material layer comprises a second metal oxide, and
the second metal oxide is the same group as or a different group from the first metal oxide.

24. The memory device of claim 23, wherein the first metal oxide comprises at least one of tantalum (Ta) oxide, zirconium (Zr) oxide, yttria-stabilized zirconia (YSZ), titanium (Ti) oxide, hafnium (Hf) oxide, manganese (Mn) oxide, magnesium (Mg) oxide, and a mixture thereof.

25. The memory device of claim 24, wherein the first metal oxide comprises $TaO_x$ (where $0<x<2.5$).

26. The memory device of claim 23, wherein the second metal oxide comprises at least one of tantalum (Ta) oxide, zirconium (Zr) oxide, yttria-stabilized zirconia (YSZ), titanium (Ti) oxide, hafnium (Hf) oxide, manganese (Mn) oxide, magnesium (Mg) oxide, and a mixture thereof.

27. The memory device of claim 19, wherein the auxiliary resistive layer comprises an oxide.

28. The memory device of claim 27, wherein the auxiliary resistive layer is a silicon oxide layer.

29. The memory device of claim 28, wherein the auxiliary resistive layer has a thickness less than or equal to about 10 nm.

30. The memory device of claim 27, wherein the auxiliary resistive layer is doped with tungsten (W).

31. The memory device of claim 19, wherein at least a portion of the memory layer is doped with tungsten (W).

32. The memory device of claim 19, wherein each of the memory cells further comprises a buffer layer between the first wires and the memory layer.

33. The memory device of claim 32, wherein the buffer layer includes at least one of $AlO_x$, $SiO_x$, $SiN_x$, $ZrO_x$, $HfO_x$, and a mixture thereof.

34. The memory device of claim 19, further comprising:
a plurality of third wires parallel to each other and crossing the second wires to form a plurality of second cross-points, a plurality of second memory cells at the second cross-points, respectively.

35. The memory device of claim 34, wherein each of the second memory cells has one of a reverse structure and a same structure, as that the first memory cells.

* * * * *